(12) United States Patent
Hougham et al.

(10) Patent No.: US 6,656,308 B2
(45) Date of Patent: Dec. 2, 2003

(54) PROCESS OF FABRICATING A PRECISION MICROCONTACT PRINTING STAMP

(75) Inventors: Gareth Hougham, Ossining, NY (US); Peter Fryer, Yorktown Heights, NY (US); Ronald Nunes, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 37 days.

(21) Appl. No.: 10/127,374

(22) Filed: Apr. 22, 2002

(65) Prior Publication Data

US 2003/0196748 A1 Oct. 23, 2003

(51) Int. Cl.[7] .................... B29C 47/02; B32B 33/00
(52) U.S. Cl. .................. 156/247; 156/344; 264/35; 264/227; 264/261
(58) Field of Search ................ 156/145, 242, 156/247, 314, 344, 246; 264/220, 222, 225, 227, 259, 261, 313

(56) References Cited

U.S. PATENT DOCUMENTS 4,130,620 A * 12/1978 Jarsen ..................... 264/225

2002/0130444 A1 * 9/2002 Hougham ................ 264/519

OTHER PUBLICATIONS

Kumar et al., Appl. Phys. Lett., 63, (14), 2002–2004 (Oct. 1993).

Hidber et al., Langmuir, 12, 1375–1380(1996).

* cited by examiner

Primary Examiner—Richard Crispino
Assistant Examiner—Sing P. Chan
(74) Attorney, Agent, or Firm—Scully, Scott, Murphy & Presser; Daniel P. Morris

(57) ABSTRACT

A process of making a microcontact printing stamp useful in microcontact printing of microcircuits. In this process an elastomeric microcontact printing stamp is formed by curing an elastomeric monomer or oligomer in a mold in which a photoresist master, defining a microcircuit in negative relief, is predisposed above a flat and rigid backplane laminate. The flat and rigid plane member of the backplane laminate is delaminated from the backplane after the printing stamp is removed from the mold.

19 Claims, 2 Drawing Sheets

PROCESS OF FABRICATING A PRECISION MICROCONTACT PRINTING STAMP

BACKGROUND OF THE DISCLOSURE

1. Field of the Invention

The present invention is directed to a formation of a microcontact printing stamp employed in the creation of microcircuitry where dimensional integrity and registration must be maintained at the micron level over very large distances that may be as long as half a meter. More particularly, the present invention is directed to a process of preparing a high precision microcontact printing stamp based on temporary rigid immobilization of the printing stamp backplane by glue lamination during curing.

2. Background of the Prior Art

The process of microcontact printing, to create a very fine pitch pattern, is of recent vintage in the art of fabricating microcircuitry. This process is described in Kumar et al., *Appl. Phys. Lett.*, 63, (14), 2002–2004(October 1993) and Hidber et al., *Langmuir*, 12, 1375–1380(1996). This process, which represents an alternative to photolithography in the fabrication of electronic components, especially where extremely fine line dimensions are required, requires the creation of a very fine pitch rubber stamp.

The very fine pitch rubber stamp utilized in microcontact printing is most often formed of an elastomeric material which is usually silicone rubber. Those skilled in the art are aware that the term "silicon rubber" denotes polydimethylsiloxane (PDMS). PDMS, it should be appreciated, denotes the reactive monomer, a reactive oligomer or a mixture thereof as well as filler and polymerization catalysts. In the current method of preparing rubber stamps used in high precision microcontact printing liquid PDMS is introduced into a mold wherein a negative relief microcircuit pattern is expressed. The polymer is thereupon cured to produce a solidified rubber stamp which is removed from the mold. The solidified rubber stamp has a microcircuit pattern expressed in positive relief. It is this pattern that is transferred to a substrate in subsequent steps in the microcontact printing process.

The positive relief pattern provided on the rubber stamp is thereupon inked onto a substrate. Although there are several variations of microprinting methodology, commonly, the substrate is blanket coated with a thin gold film and the gold coated substrate is inked with an alkane thiol material transferred thereto by the stamp. Commonly, the alkane thiol material has the structural formula $CH_3$—$(CH_2)_{18}$—$CHSH_2$. It should, of course, be appreciated that other alkane thiol materials, as well as other inks, can be substituted for this alkane thiol.

Upon contact of the positive relief pattern of the stamp with the gold film, a monolayer of the ink, preferably an alkane thiol, having the desired microcircuit pattern, is transferred to the gold film layer. Alkane thiols form an ordered monolayer on gold by a self assembly process. Thus, a self assembled monolayer (SAM) of the desired pattern is formed on the gold layer. The SAM is tightly packed and well adhered to the gold. As such, the SAM acts as an etch resist upon contact of a gold etching solution onto the stamped gold film layer.

In the next step, the inked substrate is immersed in a gold etching solution and all but the SAM is etched away to underlying layers below the gold layer. The SAM, which is protected, and thus not affected by the etchant, is then stripped away leaving gold in the desired pattern.

The aforementioned description is set forth in the Kumar et al. technical article. The Hidber et al. technical article utilizes a different procedure wherein the aforementioned rubber stamp is inked with a palladium catalyst and a pattern is again stamped onto a substrate. The positive release microcircuit pattern of palladium catalyst is subsequently immersed in an electroless plating solution which induces the desired microcircuit pattern by electroless plating.

The aforementioned description makes it apparent that faithful reproduction of the microcircuit pattern of the printing stamp onto the substrate is critical, especially when the pattern is of both fine pitch and of very large overall dimension. For example, if microcontact printing is used to produce microcircuitry on flat panel displays, it may require 5 micron sized defined features to accurately register to one another within one micron across a linear distance of 15 inches.

In turn, faithful reproduction of the microcircuit onto the substrate requires the fabrication of a microcontact printing stamp that faithfully reproduces the desired microcircuit pattern. This challenge to produce a high precision microcircuit printing stamp is magnified by the additional requirement that this formation of a microcontact printing stamp be simple and cost effective. This latter requirement is emphasized because a primary application of this technology is the manufacture of flat panel displays. Flat panel displays must be produced at low cost and yet must meet the stringent tolerance criteria mentioned above.

In the past microcontact printing could not meet this challenge. This was because microcontact printing stamps could not satisfy the registration requirement because of shrinkage and other distortions imposed during printing stamp preparation. That is, the elastomeric polymer would shrink in the mold during printing stamp preparation. As those skilled in the art are aware, when an elastomeric polymer, such as silicone rubber, cures in a mold it shrinks to a degree of between about 0.11% to about 4%.

This shrinkage has a magnifying effect in that it is oftentimes manifested by undulations in the backplane of the stamp which is characterized by a reversal of the pattern of distortion once printed. That is, wave crests created in the backplane, caused by shrinkage during curing, impart distortions to the microcircuit pattern at the top of the stamp when the backplane bottom of the stamp is straightened under tension. This undulation problem may be exacerbated by the natural lack of planarity of the backplane sheet. Such a situation may occur for as simple a reason as the sheet was formed in a rolling process.

Thus, it is apparent that there is a strong need in the art for a new microcontact printing stamp-forming process that provides a stamp that is characterized by good registration resulting from the prevention of undulations in the backplane during curing of the microcontact stamp in the mold.

BRIEF SUMMARY OF THE INVENTION

A new process has now been developed which results in the formation of a high precision microcontact printing stamp providing a positive relief microcircuit pattern faithful to the dimensional requirements of the desired microcircuit.

In accordance with the present invention a process of fabricating a high precision microcontact printing stamp is provided. In this process a mold is provided in which a photoresist master defining a desired microcircuit pattern in negative relief is disposed above a backplane temporarily adhered to a flat and rigid substrate. An elastomeric monomer or oligomer system is thereupon introduced into the mold and the elastomeric monomer is thereupon cured to form an elastomeric microcontact stamp whose top surface defines the desired microcircuit in positive relief. The bottom of the microcontact stamp is defined by a laminate of the backplane adhered to the flat and rigid substrate. The thus formed microcontact stamp is removed from the mold and the rigid and flat substrate is separated from the backplane.

BRIEF DESCRIPTION OF THE DRAWINGS

The present invention may be better understood by reference to accompanying drawings of which.

DETAILED DESCRIPTION

Figure 1:
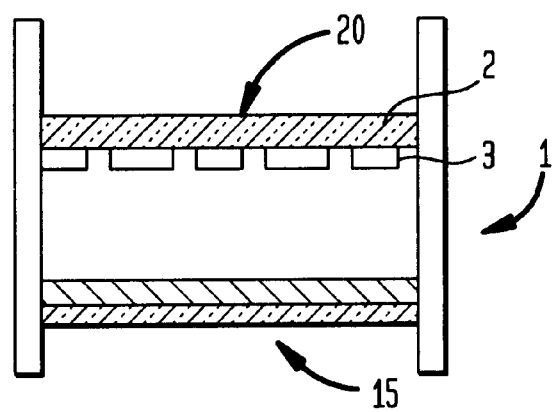
FIG. 1 is a sectional elevation view of a mold prior to the introduction of an elastomeric monomer.

The recently developed process of microcontact printing, often called "soft-lithography," requires the preparation of a very fine pitch pattern on the surface of a rubber stamp. It is to this preparation that the present invention is directed.

The process of preparing a very fine pitch pattern on the surface of a rubber stamp occurs in a molding process. In this molding process a mold housing 1 is provided into which a photoresist master assembly 20, which includes a photoresist master 3, defining the desired microcircuit, disposed upon and affixed to a rigid substrate 2, is predisposed above a flexible stamp backing assembly 15 which is more commonly referred to as a backplane assembly 15. Backplane assemblies of the prior art were limited to a flexible member or, in an attempt to overcome the problems associated with the flexibility of the backplane, the backplane was disposed, in a non-adhering manner, upon a rigid plane, such as glass. It was originally believed that the pressure of the subsequent monomer or oligomer injection process flattened the backplane down against the rigid glass member and held it there. Actual experience has shown that injection pressure is inadequate.

Figure 2:
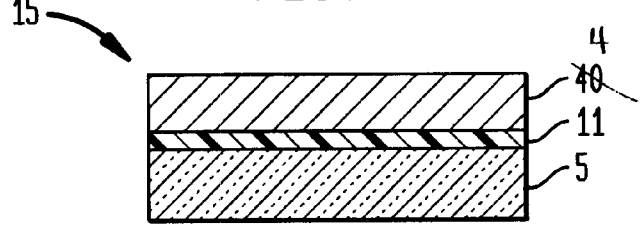
FIG. 2 is an exploded sectional view of one of components illustrated in FIG. 1.
Figure 3:
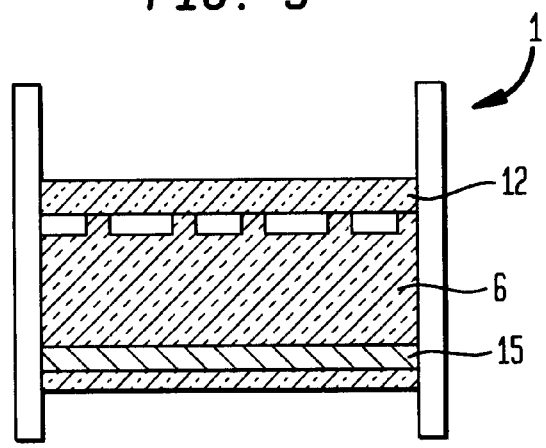
FIG. 3 is a sectional elevation view of the mold upon introduction of an elastomeric monomer.

In the present invention, the backplane assembly 15 is a laminate of a flexible backplane 40 bonded to a flat and rigid planar member 5. As shown in FIG. 2, the backplane laminate assembly 15 is formed by disposing backplane 40 upon a flat and rigid sheet 5. An adhesive 11 is disposed between the backplane 40 and the sheet 5.

In a preferred embodiment the flat and rigid member 5 is a glass sheet. Indeed, FIG. 2 illustrates the flat plane 5 as being transparent, a characteristic of glass. The backplane 40 is a flexible material. Preferably, this flexible material is a flexible metal. Such flexible metals as stainless steel, steel alloys containing nickel, e.g. Invar® alloys, nickel-titanium alloys, e.g. Nicol®alloys, and the like are thus particularly preferred for use as the backplane.

In view of the criticality of maintaining the backplane absolutely flat and rigid, it is imperative that the backplane 40 be laminated to the flat and rigid plane 5 so that the backplane 40 is firmly adhered to the plane 5 without any gas being trapped therebetween. As such, the flexible backplane 40 and rigid planar member 5 are bonded, by an adhesive 11, under high pressure or under vacuum.

The chemical and physical properties of the adhesive 11, disposed between backplane 40 and rigid plane 5, are of critical importance. In the past, the advantages of the present invention could not be obtained because, although the above-discussed backplane assembly 15 could be prepared, the rigid plane 5 could not be removed from the printing stamp since delamination would destroy the effectiveness of the printing stamp.

A significant advance of the process of the present invention is addressed by providing a method of delaminating the backplane 40 from the rigid plane 5. In one preferred embodiment this result is obtained by utilizing a photodeblockable adhesive. As those skilled in the art are aware, photodeblockable adhesives strongly adhere to substrates but the adhesive is deblocked, and thus no longer adheres, if exposed to ultraviolet light. Thus, the advantage of the rigid and flat plane 5 being glass. Most glasses are transparent to ultraviolet light. Other flat and rigid planar materials that are ultraviolet light transparent, of course, may alternatively be utilized.

In another preferred embodiment the adhesive used in the formation of the laminate assembly 15, the adhesive 11 is an adhesive ablatively decomposable upon exposure to laser light. Among laser ablative adhesives employable in the present invention are polyacrylates, epoxies, polyimides, polyurethanes and the like. Again this methodology emphasizes the desirability of employing a laser transparent, flat and rigid plane 5, a property that most glasses also possess to effectuate adhesive decomposition.

The use of either preferred class of adhesive 11 provides easy removal, without any disturbance to the integrity of backplane 40 portion of the elastomeric stamp 1. The exposure of the product printing stamp 9 to ultraviolet or laser light, as the case may be, results in facile separation of the glass 5 from the backplane 40, which remains integral with the remainder of the microcontact stamp 9.

The elastomeric monomer 6, which generically encompasses catalyst, promoters and the like, and which may also be oligomeric, is introduced into the mold so that it fills the space between the photoresist assembly 12 and the backplane assembly 15. Preferred elastomeric monomers or oligomers include dimethylsiloxane, oligomers thereof, monomeric or oligomeric precursors of polyurethanes, epoxy rubbers, polyphosphazines, butadiene rubbers, vulcanized rubbers and the like.

The elastomeric monomer or oligomer is thereupon cured to produce a thermoset elastomeric product 7 whose top portion defines the microcircuit imparted by the photoresist master 3. The thermoset polymerization reaction is typically conducted at a temperature in the range of between about 40° C. and about 80° C. Preferably, the curing polymerization reaction occurs at a temperature in the range of between about 50° C. and about 70° C. Most preferably, the temperature of the elastomeric curing polymerization reaction is in the range of between about 55° C. and about 65° C. Indeed, these curing temperature ranges are particularly preferred when the preferred monomer, dimethylsiloxane, or an oligomer thereof is employed.

Figure 4:
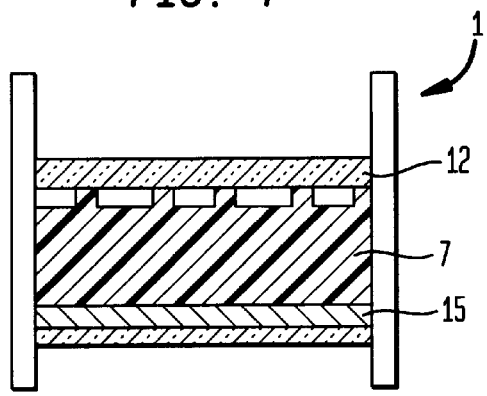
FIG. 4 is a sectional elevational view of the mold upon curing of the elastomeric monomer to form an elastomeric resin.

As illustrated in FIG. 4, the bottom of the thermoset polymerization product, the backplane assembly 15, is characterized by a flat undisturbed plane, due to firmness provided by the rigid and flat plane 5 layer of the assembly 15.

Figure 5:
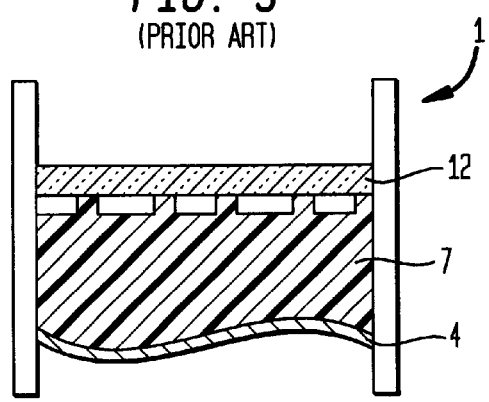
FIG. 5 is a sectional elevation view of the mold upon curing of the elastomeric monomer to form an elastomeric resin in the absence of the inventive feature.
Figure 6:
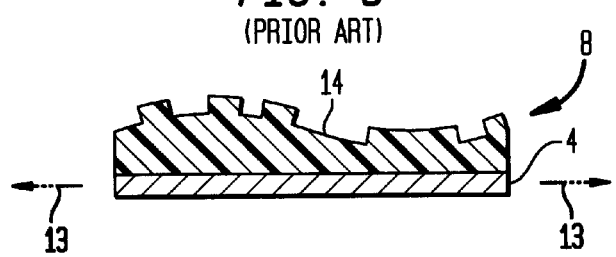
FIG. 6 is a sectional elevation view of the microcontact stamp made in accordance with the prior art process illustrated in FIG. 5.

On the other hand, when previous practice is followed, wherein the above procedure is followed but for the step of laminating the flat and rigid plane 5 to the backplane 4 and, instead, a backplane 4 is merely disposed on a flat plane 5, the flat plane 5 separates from the backplane 4. As shown in FIG. 5, waviness of the backplane, resulting from shrinkage during curing and from simple stresses in the backplane metal, occurs.

This undesirable result occurs upon removal of the product microcontact stamp 8 from the mold in the prior art process, illustrated by FIG. 5. Upon imposition of tension to the thus formed printed stamp 8 of the prior art, as indicated by the arrows 13, waviness or non-linearity to the positive relief microcircuit portion 14 of elastomeric stamp 8 occurs, resulting in an unusable product.

Figure 7:
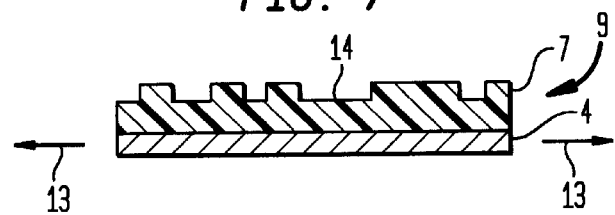
FIG. 7 is a sectional elevational view of the microcontact stamp made in accordance with the present invention.

The microcircuit stamp 9 of the present invention, on the other hand, when removed from mold housing 1, subsequent to the delamination step of the rigid layer 5 of the backplane assembly 15, has the appearance illustrated in FIG. 7. This desirable result occurs because the retention of the rigid plane 5 during the curing step insures proper alignment of the elastomeric microcircuit pattern 14. This result also occurs because delamination, effected by ultraviolet or laser light exposure, is easily accomplished.

The above embodiments are provided to illustrate the scope and spirit of the present invention. These embodiments will make apparent, to those skilled in the art, other embodiments and examples. Those other embodiments and examples are within the contemplation of the present invention. Therefore, the present invention should be limited only by the appended claims.

What is claimed is:

1. A process of making a microcontact printing stamp comprising the steps of:
    disposing a photoresist master, defining a microcircuit pattern in a negative relief, in a mold above a backplane laminate comprising a backplane bonded to a flat and rigid plane;
    introducing an elastomeric monomer or oligomer into said mold;
    curing said elastomeric monomer or oligomer in said mold wherein a cured elastomeric printing stamp imprinted with said microcircuit in positive relief, defined by said photoresist master, is formed;
    removing said cured elastomeric stamp from said mold; and
    delaminating said flat and rigid plane from said stamp.

2. A process in accordance with claim 1 wherein said backplane laminate is formed by bonding said backplane to said flat and rigid plane by an adhesive.

3. A process in accordance with claim 2 wherein said adhesive of said backplane laminate is a photodeblockable adhesive.

4. A process in accordance with claim 3 wherein said backplane laminate is delaminated by exposing said cured microcontact stamp to ultraviolet light.

5. A process in accordance with claim 4 wherein said flat and rigid plane of said backplane laminate is transparent to ultraviolet light.

6. A process in accordance with claim 2 wherein said adhesive of said backplane laminate is an adhesive ablatively decomposable upon exposure to laser light.

7. A process in accordance with claim 6 wherein said backplane laminate is delaminated by exposure of said cured microcontact stamp to laser light.

8. A process in accordance with claim 7 wherein said flat and rigid plane of said backplane laminate is transparent to laser light.

9. A process in accordance with claim 1 wherein said elastomeric monomer or oligomer is dimethylsiloxane or an oligomer thereof.

10. A process in accordance with claim 9 wherein curing step occurs at a temperature in the range of between about 40° C. and about 80° C.

11. A process in accordance with claim 1 wherein said backplane is a flexible metal sheet.

12. A process in accordance with claim 11 wherein said flexible metal sheet is selected from the group consisting of stainless steel, a steel alloy containing nickel and a nickel-titanium alloy.

13. A process in accordance with claim 1 wherein said and flat rigid plane of said backplane laminate is glass.

14. A process of making a microcontact printing stamp comprising the steps of:
    disposing a photoresist master, defining a microcircuit in negative relief, in a mold above a backplane laminate of a backplane bonded to a flat and rigid plane;
    introducing a dimethylsiloxane-containing polymerizable composition into said mold;
    curing said polymerizable composition at a temperature in the range of between about 50° C. and about 70° C. whereby a silicone rubber printing stamp imprinted with a microcircuit in positive relief, defined by said photoresist master, is formed;
    removing said cured silicone rubber stamp from said mold; and
    delaminating said flat and rigid plane from said silicone rubber stamp.

15. A process in accordance with claim 14, wherein said photoresist master comprises an assembly of a microcircuit pattern bonded to a flat and rigid glass plane.

16. A process in accordance with claim 14 wherein said curing temperature is in the range of between about 55° C. and about 65° C.

17. A process in accordance with claim 14 wherein backplane laminate comprises a metal backplane selected from the group consisting of stainless steel, a steel alloy containing nickel and a nickel-titanium alloy and a glass plane bonded together by an adhesive selected from the group consisting of photodeblockable adhesives and ablatively decomposable adhesives.

18. A process in accordance with claim 17 wherein said adhesive of said backplane laminate is a photodeblockable adhesive and said delamination step occurs by exposing said backplane laminate to ultraviolet light.

19. A process in accordance with claim 17 wherein said adhesive of said backplane laminate is an ablatively decomposable adhesive and said delamination step occurs by exposing said backplane laminate to laser light.

* * * * *

UNITED STATES PATENT AND TRADEMARK OFFICE
CERTIFICATE OF CORRECTION

PATENT NO. : 6,656,308 B2  
DATED : December 2, 2003  
INVENTOR(S) : Peter Fryer et al.

It is certified that error appears in the above-identified patent and that said Letters Patent is hereby corrected as shown below:

<u>Title page</u>,
Item [75], Inventors, insert -- Mary Beth Rothwell, Ridgefield, CT (US) --

<u>Column 3</u>,
Lines 55, 57 and 62, "40" should read -- 4 --

<u>Column 4</u>,
Lines 1, 3, 4, 6, 9, 39 and 42, "40" should read -- 4 --

Signed and Sealed this

Eleventh Day of May, 2004

JON W. DUDAS
*Acting Director of the United States Patent and Trademark Office*